United States Patent [19]

Nitta et al.

[11] Patent Number: 5,202,895
[45] Date of Patent: Apr. 13, 1993

[54] SEMICONDUCTOR DEVICE HAVING AN ACTIVE LAYER MADE OF INGAALP MATERIAL

[75] Inventors: Koichi Nitta, Kawasaki; Masayuki Ishikawa, Tokyo; Yukie Nishikawa, Narashino; Hideto Sugawara; Minoru Watanabe, both of Tokyo; Masaki Okajima, Kawasaki; Genichi Hatakoshi, Yokohama, all of Japan

[73] Assignee: Kabushiki Kaisha Toshiba, Kawasaki, Japan

[21] Appl. No.: 695,088

[22] Filed: May 3, 1991

[30] Foreign Application Priority Data

May 7, 1990 [JP] Japan .................. 2-117346
Aug. 24, 1990 [JP] Japan .................. 2-221281
Jan. 9, 1991 [JP] Japan .................. 3-1082

[51] Int. Cl.[5] .............................. H01S 3/19
[52] U.S. Cl. .................................. 372/45
[58] Field of Search .......................... 372/45, 46

[56] References Cited

U.S. PATENT DOCUMENTS 4,719,155 1/1988 Matsumoto .................. 428/700
4,893,313 1/1990 Hatakoshi et al. ........... 372/46
4,949,349 8/1990 Ohba et al. .................. 372/45

FOREIGN PATENT DOCUMENTS 214534  3/1987 European Pat. Off. .
328393  8/1989 European Pat. Off. .
334637  9/1989 European Pat. Off. .
353033  1/1990 European Pat. Off. .
426419  5/1991 European Pat. Off. .
57-69793 4/1982 Japan .

OTHER PUBLICATIONS

H. Asai et al.; "Energy band-gap shift with elastic strain in $Ga_xIn_{1-x}P$ epitaxial layers on (001) GaAs substrates"; Apr. 1983, pp. 2052-2056, Journal of Applied Physics, vol. 54.
N. K. Dutta et al.; "Performance characteristics of $In_{0.2}Ga_{0.8}As/GaAs$ multiquantum-well lasers"; Oct., 1990, pp. 3822-3825, Journal of Applied Physics, vol. 68.
"Gain characteristics of strained quantum well lasers", vol. 56, No. 1, Applied Physics Letters, Jan. 1, 1990, D. F. Welch, pp. 10-12.
"A New Transverse-Mode Stabilized InGaAlP Visible Light Laser Diode Using p-p Isotype Heterbarrier Blocking", vol. 27, No. 12, Japanese Journal of Applied Physics, Dec. 1988, K. Itaya et al, pp. L2414-L2416.
"Room-temperature, continuous-wave operation for mode-stabilised AlGaInP visible-light semiconductor laser with a multiquantum-well active layer", vol. 24, No. 24, Electronics Letters, Nov. 24, 1988 Stevenage, Herts, GB, pp. 1489-1490.
"Very Low Threshold Current $ALGaInP/Ga_xIn_{1-x}P$ Strained Single Quantum Well Visible Laser Diode", vol. 26, No. 17, Electronics Letters, Aug. 16, 1990, T. Katsuyama et al, pp. 1375-1377.

Primary Examiner—James W. Davie
Attorney, Agent, or Firm—Oblon, Spivak, McClelland, Maier & Neustadt

[57] ABSTRACT

A semiconductor laser device comprises a compound semiconductor substrate, a first cladding layer formed on the substrate, an active layer formed on the first cladding layer, made of $In_{1-y}(Ga_{1-x}Al_x)_yP$ material ($0 \leq x < 1$, $0 \leq y < 1$), and a second cladding layer formed on the active layer. These first cladding layer, the active layer, and the second cladding layer forms a double heterostructure. A lattice constant of the active layer is larger than that of the substrate by 0.3% or more. The lattice constants of the first and second cladding layers are substantially equal to that of the substrate.

11 Claims, 10 Drawing Sheets

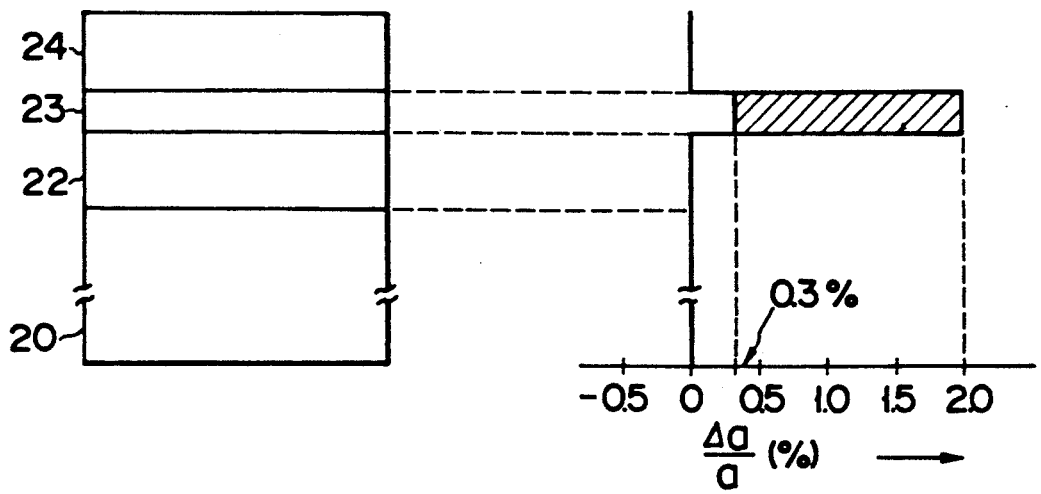
F I G. 5
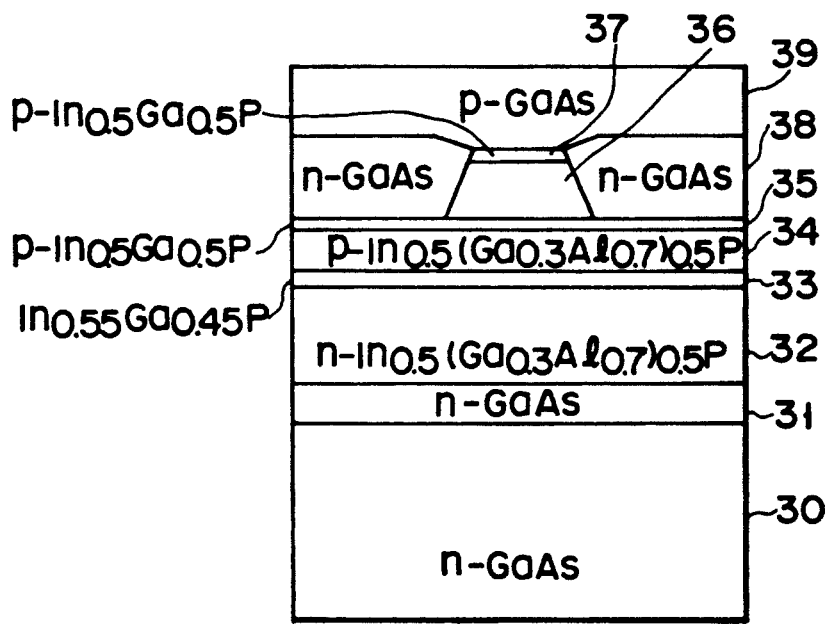
F I G. 6

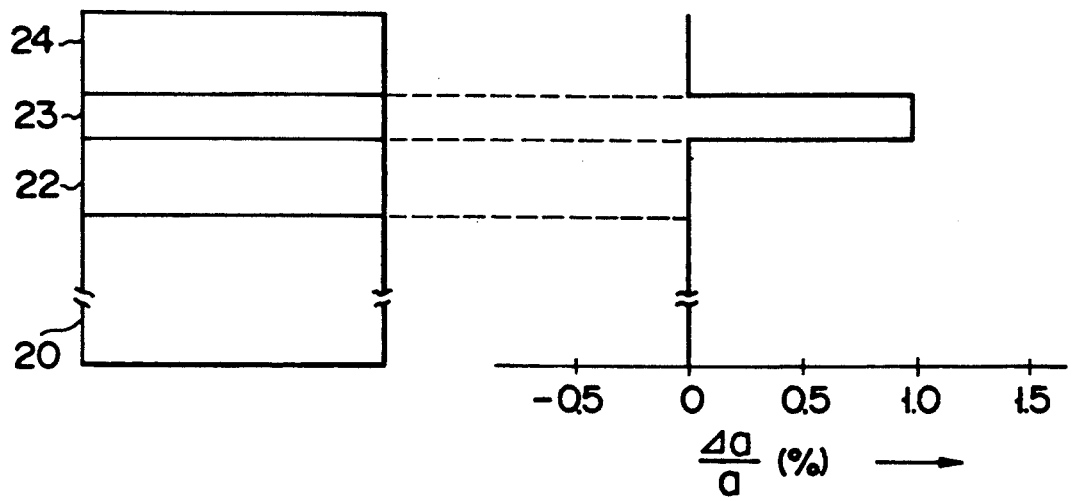
F I G. 9.
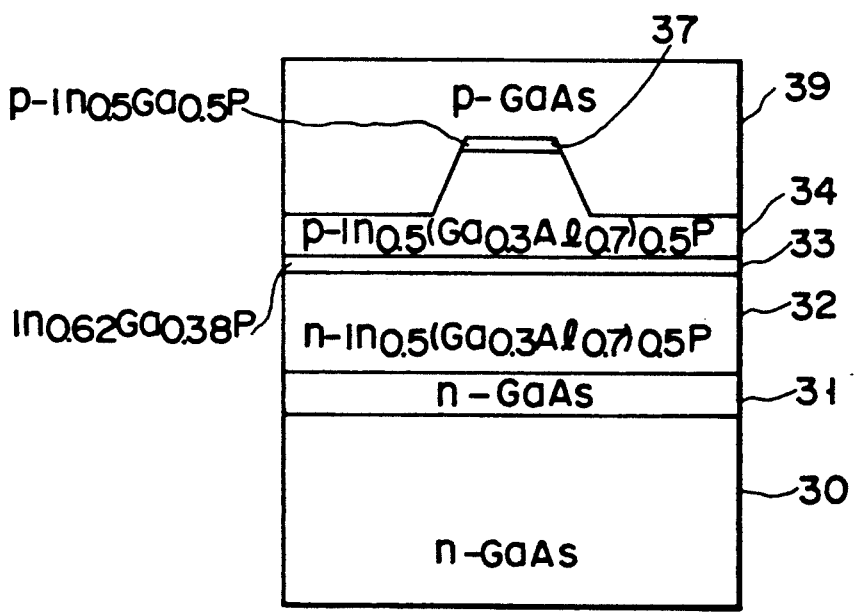
F I G. 10

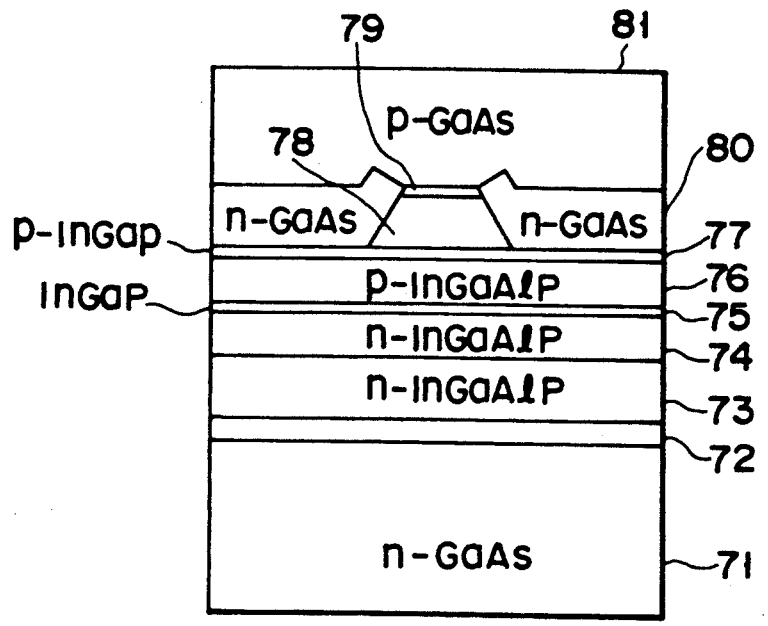
F I G. 15
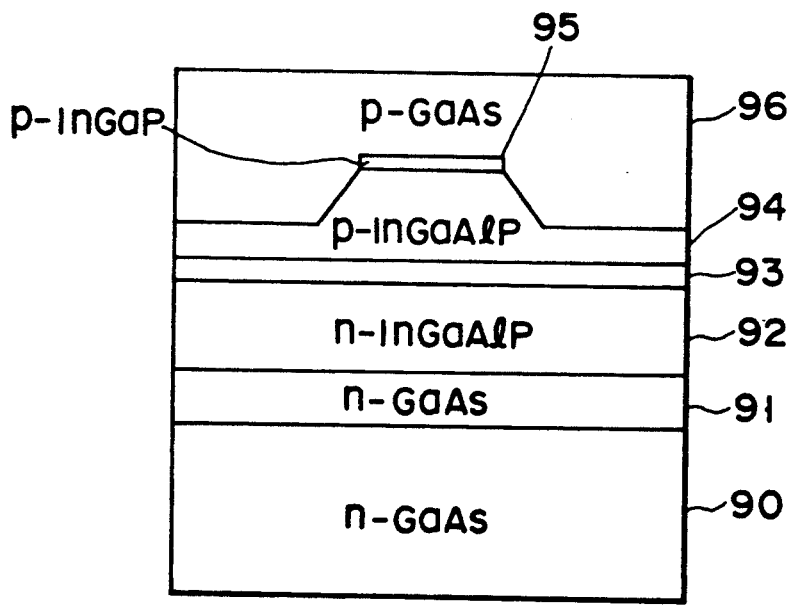
F I G. 16

SEMICONDUCTOR DEVICE HAVING AN ACTIVE LAYER MADE OF INGAALP MATERIAL

BACKGROUND OF THE INVENTION

1. Field of the Invention

The present invention relates to a semiconductor laser device, and more particularly to a semiconductor laser device having an active layer made of an InGaAlP material.

2. Description of the Related Art

In recent years, an InGAlP material, which has a maximum band gap in semiconductor mixed crystal of III-V group compound other than nitride has attached special interest as an light emitting material in a wavelength of 0.5 to 0.6 μm. Particularly, a semiconductor laser, which has a double heterostructure using GaAs as a substrate and InGaAlP lattice-matching therewith as a material of an active layer and a cladding layer, can oscillate visible light having a wavelength of 0.6 μm at a room temperature and can be used to various applications which are not found in a semiconductor laser of an infrared region.

Since such a semiconductor laser has a short oscillation wavelength, a small beam spot can be obtained and such a semiconductor laser can be used as a light source which can perform a high density recording in an optical disc. In this case, however, such a semiconductor laser must be stably operated with an optical output of 30 mW or more.

It can be considered that the cause for restricting the optical output of the semiconductor laser is occurrence of a kink (linearity of current—optical power output characteristic is lost and bending occurs) in a current-optical power output characteristic. If kink is generated, a transverse mode is deformed and a beam characteristic is worsened. Due to this, it is difficult to use this type of the semiconductor laser as a light source for an optical disk or the like. Therefore, there is required a semiconductor laser having high kink level in order to maintain a good beam characteristic and obtain a high optical power.

Moreover, the so-called COD (Catastrophic optical damage) can be considered as another cause for restricting the optical power of the semiconductor laser.

More specifically, an active layer absorbs the oscillated laser beam itself, thereby a electron-hole pair is generated. Then, the electron-hole pair generates heat when non-emission recombination is caused, so that temperature rises. Moreover, a positive feedback is effected wherein light absorption becomes stronger by reduction of the energy gap. Due to this, crystal fusion is caused in the vicinity of the end surface of laser having high optical-power density, so that the laser is broken. COD depends on optical power density. In other words, in a case where an amount of light, which is enclosed in the active layer, is higher or the mode width is narrower, optical-power density for COD is attained in a low optical power output and the laser device is broken. Therefore, there is required a semiconductor laser having high COD level in order to obtain high optical power.

Normally, in order to increase the COD level, the active layer is thinned to reduce optical-power density in the active layer. However, in the semiconductor laser using InGaAlP, if the active layer is thinned, it is difficult to use a material having sufficiently large energy gap as a cladding layer, which is positioned at both sides of the active layer and serves to confine an injection carrier. More specifically, if the active layer is thinned, a threshold current density increases and the carrier having high energy contributes to the oscillation, so that the band gap in the active layer seems to equivalently increase. Due to this, the difference between the active layer and the cladding layer in energy gap becomes small, and the injection carrier cannot be effectively confined. Moreover, if an operation temperature increases, the reduction of the optical output is remarkable, so that it is difficult to perform an operation with high optical power.

In addition, to make it possible to perform a stable operation for a long period of time with high output, it is necessary to lower the operating current at a room temperature or temperature higher than the room temperature. Also, a laser device having a low threshold current and high differential quantum efficiency (slope efficiency) must be realized As means for solving the above-mentioned problems, it has been considered that a method using a QW (Quantum Well) structure in the active layer is effective. In QW structure, a quantum well layer having a thickness of a wavelength of a wave function of an electron or less is sandwiched between wall layers which have energy gap larger than that of the quantum well layer and serve as barriers against an electron in the quantum well. The QW structure comprises a single quantum well (SQW) or multiple quantum well, and accompanies with an optical guide layer for confining optical power. Since an electron state in the stacking direction is quantified, and the state density increases in a step manner, a gain against the injection current becomes large and a low threshold value can be obtained. Due to this, even if the amount of optical confining in the quantum well layer is reduced, there is a possibility that oscillation having good threshold value and temperature characteristic will be obtained. It can be considered that the reduction of the amount of optical confinement is effective in improving the level against the generation of a kink due to a hole burning or the generation of COD due to light absorption.

However, in the semiconductor laser having an active layer of the quantum well structure, the energy gap equivalently increases by the quantification of the electron state, and the oscillation wavelength is shortened. The degree of shortening the wavelength varies depending on the thickness of the quantum well layer and the sizes of hetero-barriers consisting of the quantum well layer and the wall layer. More specifically, when the quantum well layer is made of $In_{0.5}Ga_{0.5}P$ of a thickness of 80 Å lattice-matching with a GaAs substrate and the barrier layer is formed of $In_{0.5}(Ga_{0.5}Al_{0.5})_{0.5}P$, the oscillation wavelength was shortened by about 15 nm than that of the double heterostructure laser wherein a bulk crystal of the same InGaP material is used as an active layer.

Such a shortening of wavelength is a fundamental phenomenon in the quantum well structure and can be seen also in the other material such as GaAlAs. However, in a case where such structure is applied to the semiconductor laser using InGaAsP material, the following serious problem is found.

Specifically, regarding the use of a cladding layer, which is positioned at both sides of the active layer and serves to confine the injection carrier, it is difficult to use the cladding layer having sufficient energy gap.

Due to the use of the quantum well structure, if the wavelength is shortened, that is, energy gap equivalently increases, an energy gap difference between the quantum well layer and the cladding layer becomes small, thereby the injection carrier cannot be effectively confined, and a threshold current increases. The increase in the threshold current is larger than the effect of low threshold current due to the use of the quantum well structure. Therefore, the effect of the quantum well structure is not always exerted in InGaAlP material.

Moreover, in conventional, in a case where InGaAlP material in which a lattice constant changes depending on its mixed crystal composition, is used in the semiconductor laser, it was considered that the difference between the substrate and the active layer in the lattice constant must be controlled to be small during the temperature at which the crystal grows from a using temperature, that is, a room temperature. This is because if the difference in the lattice constant becomes large, a misfit dislocation is generated or the expansion of the defect due to the generation of stress is improved, so that the characteristic is easily deteriorated. Particularly, in the semiconductor laser having a high injection current density and a high optical power density, such deterioration of the characteristic considerably appears by increase in the misfit dislocation or the defects.

In the normal semiconductor laser, if the difference between the substrate and the active layer in the lattice constant (degree of lattice mismatching) $\Delta a/a$ is set to $\Delta a/a = (a - a_0)/a_0$, it was set forth as a premise that the degree of the lattice mismatching is set to be about 0.2% or less In this equation, a is a lattice constant of InGAlP layer and $a_0$ is a lattice constant of the substrate.

FIG. 1 is a cross section showing a schematic structure of a conventional InGaAlP semiconductor laser having a transverse mode control structure. In FIG. 1, reference numeral 10 denotes an n - GaAs, 11: n - GaAs buffer layer, 12: n - InGaAlP cladding layer, 13: InGaP active layer, 14: p - InGaAlP cladding layer, 17: p - InGaP cap layer, and 19: p - GaAs contact layer. The above semiconductor laser is structured to control a current restricting or a transverse mode by use of the ridge-shaped p - InGaAlP cladding layer 14, p - InGaP cap layer 17 formed on the ridge of the p - cladding layer 14, and p - GaAs contact layer 19 embedding these layers therein and functioning as a light absorbing layer against an emitting light wavelength (for example, see Applied Physics Letters, Vol. 56, No. 18, 1990, pp. 1728–1719, JAPANESE JOURNAL OF APPLIED PHYSICS, Vol, No. 12, 1988, pp.L2414–L2416).

In the structure of FIG. 1, if the respective mixed crystal compositions of the active layer 13, cladding layers 12 and 14 are set such that the degree of the lattice mismatching is 0.2% or less, a kink level was about 40 mW, thereby limiting the maximum operating optical output.

One of the mechanisms in the kink generation, the hole burning effect can be considered. In the transverse mode, that is, the portion having high optical power density in the active layer, induced emission is strongly performed by a recombination of an electron and a hole. Thereby, concentration of the electron and the hole is lowered, and a concentration distribution of the electron and the layer in the active layer is deformed. Due to this, a gain distribution is deformed and the transverse mode is deformed. At this time, it can be considered that it is difficult for the concentration distribution of the electron and the hole to be deformed as the diffusion length of the carrier becomes larger. In a case where the InGaAlP material is used, the diffusion length of the hole is small, and this can be considered as a main reason that the kink level is low.

FIG. 2 shows a temperature dependency of the current - optical output characteristic in the structure of FIG. 1. The active layer 13 was thinned (for example, 0.04 μm), thereby realizing an operation up to the optical output 20 mW. Regarding COD optical output, high COD optical output of 51 mW was obtained. However, the optical output was considerably lowered at a high temperature of 40° C. or more, a practical optical output considering an operation temperature range (around 50° C.) was 10 mW and this limited the the maximum operating optical output.

As mentioned above, in the conventional semiconductor laser having an active layer formed of InGaAlP material, there was a problem in that the kink level becomes low due to the hole burning effect, thereby limiting the maximum operating optical output.

Also, if the active layer is thinned and the optical output generating COD is increased, the maximum optical output at a high temperature becomes low due to the deterioration of the temperature characteristic according to the increase in the threshold current, thereby limiting the maximum optical power output.

FIG. 3 shows a specific structure near the active layer having a quantum well structure, and an energy level state of an end of a conduction band in a case where the active layer 13 has a quantum well structure in the device of FIG. 1.

Reference numeral 13a denotes an InGaP quantum well layer (four-layered structure). Reference numeral 13b is an InGaAlP wall layer. The energy level of the conduction band corresponds to the energy gap itself in the range of Al content x expressed in $In_{0.5}(Ga_{1-x}Al_x)_{0.5}P$, particularly, x<0.7, which is a direct transition type energy gap.

FIG. 4 is a relationship among the oscillation wavelength against the thickness of the quantum well layer 13a, the threshold current, and the kink level in a case where the mixed crystal composition of each layer is set to satisfy the range (±0.2%) of the above-mentioned degree of lattice mismatching in the structure of FIG. 3. The increase in the kink level due to thinning is recognized. However, as compared with the DH structure, the threshold value does not always decrease as the oscillation wavelength is shortened. Therefore, the maximum temperature at which oscillation can be performed decreases. Then, the kink level in the practical threshold current considering the operation temperature range is about 60 mW, thereby limiting the maximum optical output, which can used.

As mentioned above, in the conventional semiconductor laser having an active layer of the quantum well structure formed of InGaAlP material, there was a problem in that the maximum operating optical power output was limited due to the generation of the kink level and the increase in the threshold current derived from shortening the wavelength.

SUMMARY OF THE INVENTION

An object of the present invention is to provide a semiconductor laser device which can operate at a higher temperature and improve a maximum operating optical power output.

Another object of the present invention is to provide a semiconductor laser device which can improve a kink level without increasing a threshold current by shortening the oscillation wavelength, and improve a maximum operating optical output.

The feature of the present invention lies in the point that a difference between a lattice constant of an active layer and that of a substrate is increased, and a band gap of the active layer is narrowed, and the band gap difference between the cladding layer and the active layer is increased.

Accordingly, the present invention provides a semiconductor laser device, comprising:

a compound semiconductor substrate; and a double heterostructure, which is formed on the compound semiconductor substrate, and including:

an active layer having a lattice constant layer than that of said substrate by 0.3% or more, and first and second surfaces;

a first cladding layer formed on the first surface of the active layer; and a second cladding layer formed on the second surface of the active layer.

Moreover, the feature of the present invention lies in the point that a difference between a lattice constant of a quantum well layer and that of a substrate is increased, thereby improving a kink level.

More specifically, the present invention provides a semiconductor laser device, comprising:

a compound semiconductor substrate; and a double heterostructure, which is formed on the compound semiconductor substrate, and including:

an active layer having a first and second surfaces, and comprising a quantum well layer made of a direct transition type compound semiconductor having a lattice constant different depending on the composition of said active layer, and a pair of barrier layers sandwiching said quantum well layer, a lattice constant of said quantum well layer being larger than that of said substrate by 0.5% or more;

a first cladding layer formed on the first surface of the active layer; and a second cladding layer formed on the second surface of the active layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a view showing a degree of a lattice mismatching of a double heterostructure in the semiconductor laser relating to the first embodiment of the present invention;

FIG. 6 is a cross sectional view showing a schematic view of an InGaAlP semiconductor laser having a stabilized transverse mode to which the structure of FIG. 1 is applied;

FIG. 9 is a general view showing a degree of a lattice mismatching of a double heterostructure in the semiconductor laser relating to the second embodiment of the present invention;

FIG. 10 is a cross sectional view showing a schematic view of an InGaAlP semiconductor laser having a stabilized transverse mode to which the structure of FIG. 9 is applied;

FIG. 15 is a cross sectional view showing a schematic structure of the semiconductor laser relating to the fifth embodiment of the present invention;

FIG. 16 is a cross sectional view showing a schematic structure of the semiconductor laser relating to the sixth embodiment of the present invention;

DETAILED DESCRIPTION OF THE PREFERRED EMBODIMENTS

Figure 1:
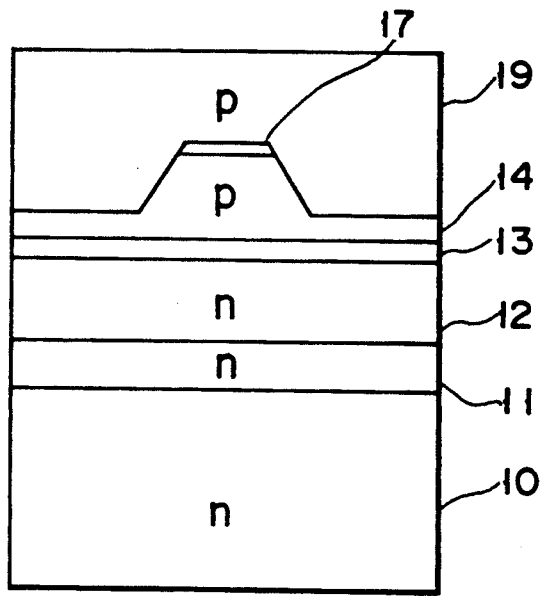
FIG. 1 is a cross sectional view showing a schematic structure of an InGaAlP semiconductor laser having a stabilized transverse mode.
Figure 2:
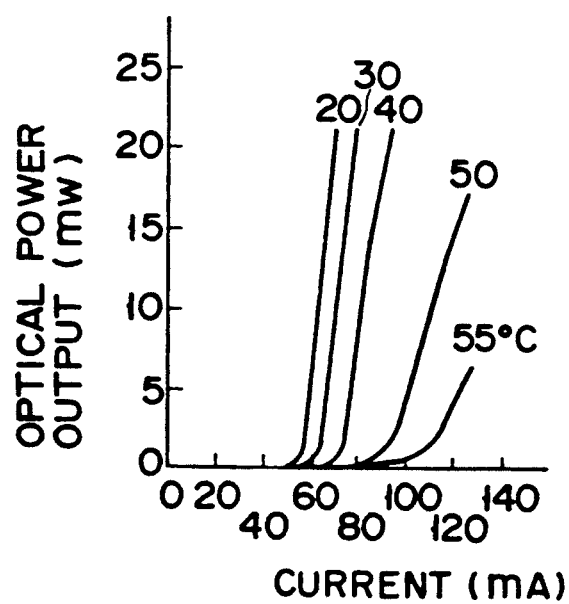
FIG. 2 is a characteristic view showing a temperature dependency of a current—optical power output characteristic in the structure of FIG. 1.
Figure 3:
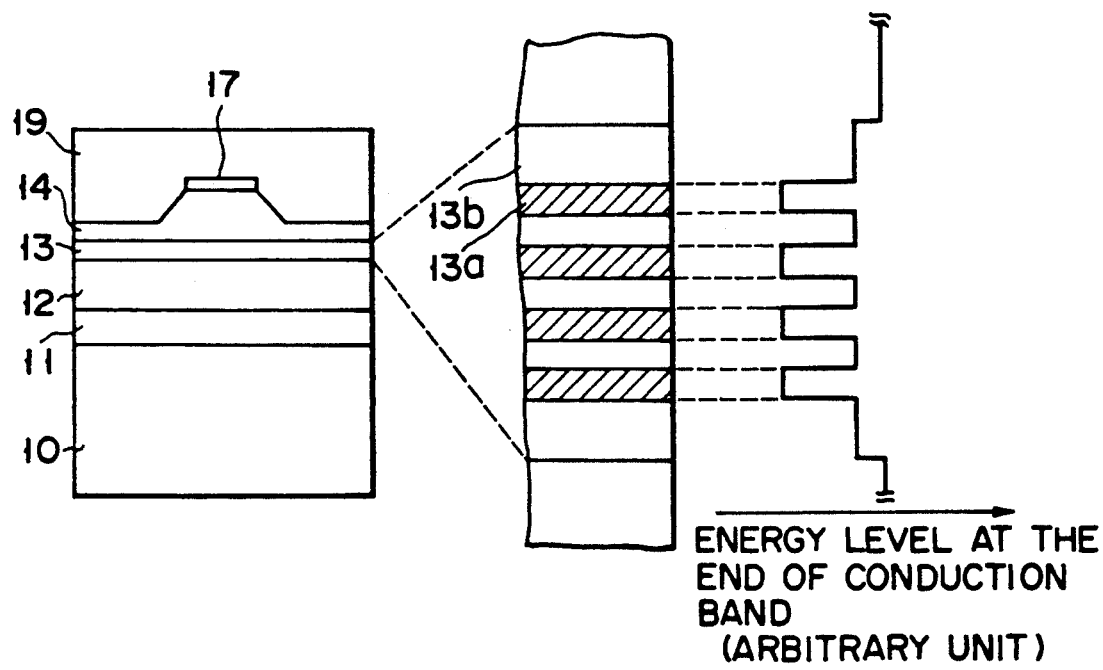
FIG. 3 is a cross section showing a schematic structure of a conventional quantum well type semiconductor laser.
Figure 4:
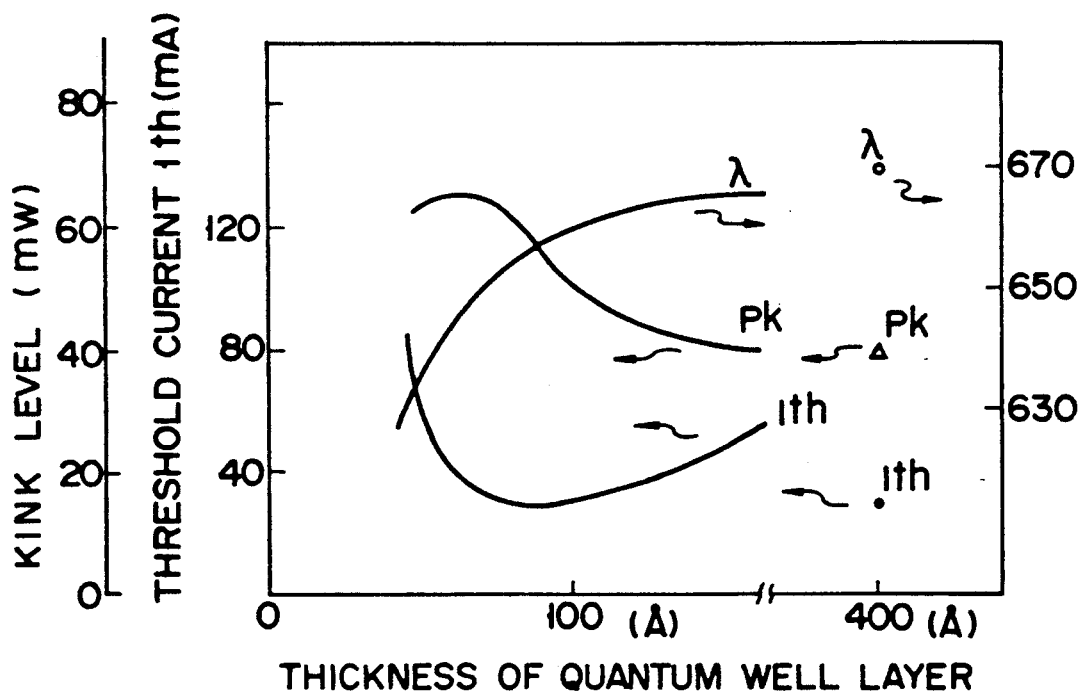
FIG. 4 is a graph showing the relationship among a kink level in the semiconductor laser of FIG. 3, a threshold current, and an oscillation wavelength.

In the semiconductor laser device wherein a double heterostructure, which is formed by sandwiching an active layer by cladding layers, is formed on a compound semiconductor substrate, the present invention features that a lattice constant of the active layer is larger than that of the substrate by 0.3% or more. The lattice constant of the active layer is preferably 0.5% or more, more preferably 0.6% or more larger than the that of the substrate. Furthermore, the lattice constant of the active layer is favorably 0.5% or more larger than that of the substrate. Moreover, the lattice constant of the active layer is favorably 0.5 to 2.5% larger than that of the substrate.

The active layer may be made of $In_{1-y}(Ga_{1-x}Al_x)_yP$ material ($0 \leq x < 1$, $0 \leq y < 1$).

The thickness of the active layer is preferably 0.01 to 0.1 μm, and more preferably 0.02 to 0.1 μm.

GaAs can be used as a semiconductor substrate. The first and second cladding layers are made of $In_{1-W}(Ga_{1-V}Al_V)_WP$ material ($0 \leq V < 1$, $0 \leq W < 1$). The first and second cladding layers have conductivity types opposite to each other.

The first cladding layer on the side of the semiconductor substrate can be formed of a lower cladding layer and an upper cladding layer.

In $In_{1-y}(Ga_{1-x}Al_x)_yP$ material constituting the active layer and $In_{1-W}(Ga_{1-V}Al_V)_WP$ material constituting the cladding layer, the values of x, y, v, and w are preferably in the following ranges:

| $0 \leq x \leq 0.3$, | $0.17 < y < 0.51$ |
|---|---|
| $0.50 < w < 0.52$, | $0.6 < v < 1.0$ |

If the lattice constant of each layer is a, and that of the substrate is $a_0$, a difference in the lattice constant (degree of lattice mismatching) $\Delta a/a$ between the substrate and each layer can be expressed by the following equation:

$$\Delta a/a = (a - a_0)/a_0$$

The degree of lattice mismatching $\Delta a/a$ can be set to a predetermined value by suitably adjusting the composition of each layer.

For example, if $x = 0$ in $In_{1-y}(Ga_{1-x}Al_x)_yP$ material constituting the active layer, there is a relationship between y in $In_{1-y}Ga_yP$ and the degree of lattice mismatching $\Delta a/a$ as follows:

| $\Delta a/a$ (%) | y |
|---|---|
| −3.8 (lower limit) | 1.0 |
| 0 | 0.514 |
| +0.3 | 0.4738 |
| +0.5 | 0.447 |
| +0.6 | 0.433 |
| +1 | 0.379 |
| +2 | 0.2438 |
| +3.8 (upper limit) | 0 |

Additionally, the semiconductor substrate and the cladding layer are substantially lattice-matched.

According to the present invention, if the lattice constant of the active layer is 0.3% larger than that of the substrate, that is, the degree of lattice mismatching $\Delta a/a$ is 0.3 or more, the band gap of the active layer is reduced, and the band gap difference between the active layer and the cladding gap can be made large. Due to this, a temperature characteristic can be improved by the reduction of the overflow of the injection carrier in accordance with the increase in the temperature, and the semiconductor laser, which can operate with a high optical power at a high temperature, can be realized.

Moreover, if the lattice constant of the active layer is 0.5% larger than that of the substrate, that is, the degree of lattice mismatching $\Delta a/a$ is 0.5% or more, distortion is induced in the active layer to an extent which is not so large. By this distortion, the band structure of InGaAlP used in the active layer changes, and particularly an effective mass of a valence band can be made small in the direction along the surface of the active layer. Thereby, a diffusion length of a hole in the direction along the surface direction of the active layer can be made large, and a hole burning effect, which a cause of the generation of kink, can be avoided. As a result, it is possible to perform oscillation in a stable transverse mode where no kink is generated until a high optical output.

Moreover, if the thickness of the active layer is $0.02 \pm 0.008$ μm, and the lattice constant of the active layer is 0.5 to 2% larger than that of the substrate, the semiconductor layer having a high optical output, which can operate at high temperature, can be realized with good yield.

The preferred embodiments of the present invention will be explained with reference to the drawings.

FIG. 5 is a view of a semiconductor laser device of an embodiment of the present invention and shows a degree of lattice mismatching of a double heterostructure.

In FIG. 5, reference numeral 20 denotes a GaAs substrate. Reference numerals 22 and 24 denote cladding layers made of $In_{1-W}(Ga_{1-V}Al_V)_WP$ material ($0 \leq V < 1$, $0 \leq W < 1$). Reference numeral 23 denotes an active layer made of $In_{1-y}(Ga_{1-x}Al_x)_yP$ material ($0 \leq x < 1$, $0 \leq < 1$). The mixed crystal composition is formed so that the energy gap of the active layer 23 is smaller than that of the cladding layers 22 and 24, and thus a double heterostructure, which confines optical-power and carrier in the active layer 23, is formed. The conductivity types of two cladding layers 22 and 23 are different from each other, and an electron and a hole are respectively injected into the active layer 23.

A difference in the lattice constant (degree of lattice mismatching) $\Delta a/a$ between GaAs substrate 20 and two cladding layers 22 and 24 layer is substantially zero, and $\Delta a/a$ between the substrate 20 and the active layer 23 is 0.3 to 2.5%. The energy gaps of the cladding layers 22, 24 and the active layer 23, and the degree of lattice mismatching between GaAs substrate 20 and each layer can be set by suitably selecting the numerical values of w, w, x, and y in the composition of each layer.

FIG. 6 shows an example wherein the above-mentioned double heterostructure is applied to InGaAlP semiconductor laser having a stabilized transverse mode. In FIG. 6, reference numeral 30 denotes a substrate (thickness: about 100 μm) made of n - GaAs, 31: a buffer layer (thickness: 1 μm) made of n - GaAs, 32: a cladding layer (thickness: 1.3 μm) made of n - $In_{0.5}(Ga_{0.3}Al_{0.7})_{0.5}P$, 33: an active layer (thickness: 0.02 μm) made of $In_{0.55}Ga_{0.45}P$, 34: a cladding layer (thickness: 0.3 μm) made of p - $In_{0.5}(Ga_{0.3}Al_{0.7})_{0.5}P$, 35: an etching stop layer (thickness: 50 Å) made of p - $In_{0.5}Ga_{0.5}P$, 36: a cladding layer (thickness: 1.0 μm) made of p - $In_{0.5}(Ga_{0.3}Al_{0.7})_{0.5}P$, 37: a cap layer (thickness: 500 Å) made of p - $In_{0.5}Ga_{0.5}P$, 38: a current restricting layer (thickness: 1 μm) made of n - GaAs, and 39: a contact layer (thickness: 3 μm) made of p - GaAs.

The semiconductor laser of the above embodiment is different from the conventional semiconductor laser in the structure that the degree of lattice mismatching is increased by changing the composition of the active layer 33. More specifically, in the conventional laser, $In_{0.5}Ga_{0.5}P$ was used as an active layer to lattice-match with GaAs. In this embodiment, $In_{0.55}Ga_{0.45}P$ is used, so that the lattice constant of the active layer 33 is 0.5% larger than that of the substrate 30. The degree of lattice mismatching was confirmed by a photoluminescent wavelength, an X-ray diffraction, a transmissivity type electron microscope, and so on. Also, the degree of Ga lattice mismatching i.e. 0.5% was attained by setting Ga content y and Al content x to 0.45 and 0, respectively, in $In_{1-y}(Ga_{1-x}Al_x)_yP$.

Figure 7A:
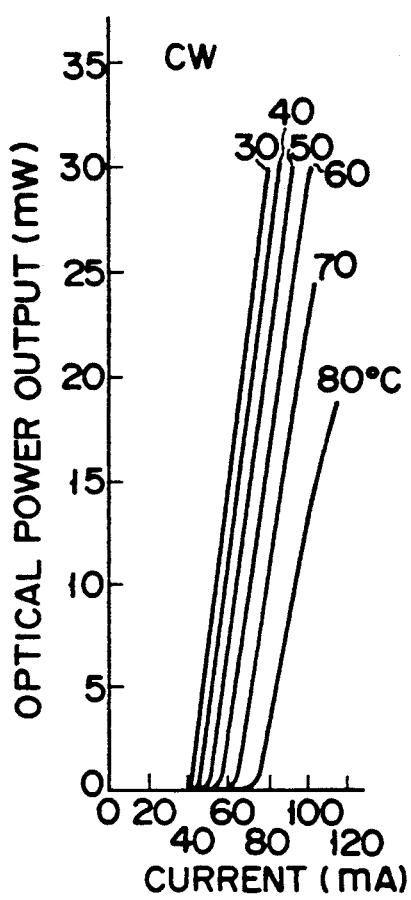
FIGS. 7A and 7B are graphs showing the relationship between a current of the semiconductor laser of FIG. 6 and an optical power output.
Figure 7B:
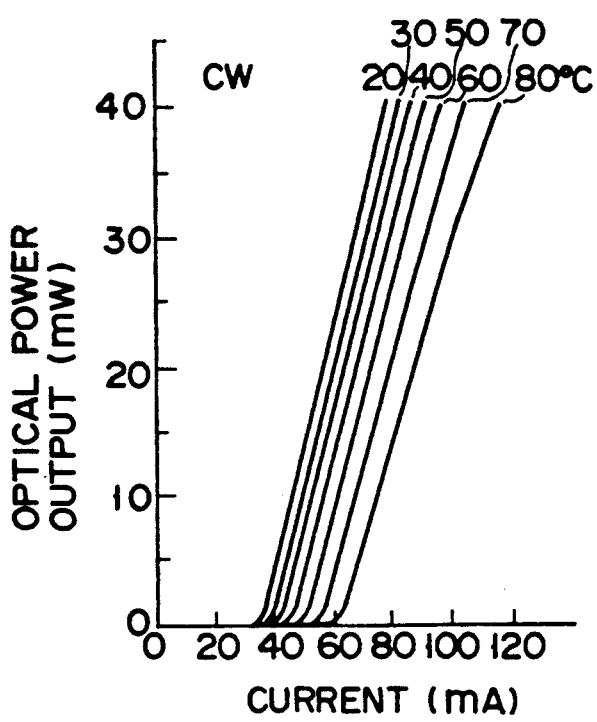

FIGS. 7A and 7B show a current - optical power output characteristic of a laser device. At this time, the thickness of the active layer 33 was 0.02 µm. The compositions of the cladding layers 33 and 34 were equal to each other, and are represented by $In_{1-y}(Ga_{1-x}Al_x)_yP$ wherein x=0.7 and y=0.5. Also, regarding impurity doping of each cladding layer, p type impurity is Zn having concentration of about $1 \times 10^{18}$ cm$^{-3}$ and n type impurity is Si having concentration of about $1 \times 10^{17}$ cm$^{-3}$.

As shown in FIG. 7A, the optical output of 30 mW can be obtained up to 60° C. FIG. 7B shows characteristic of a laser device using the active layer made of $In_{0.62}Ga_{0.38}P$ wherein the lattice constant of the active layer 33 is about 1% larger than that of the substrate 20. At this time, the optical power of 40 mW can be obtained up to 80° C.

Figure 8:
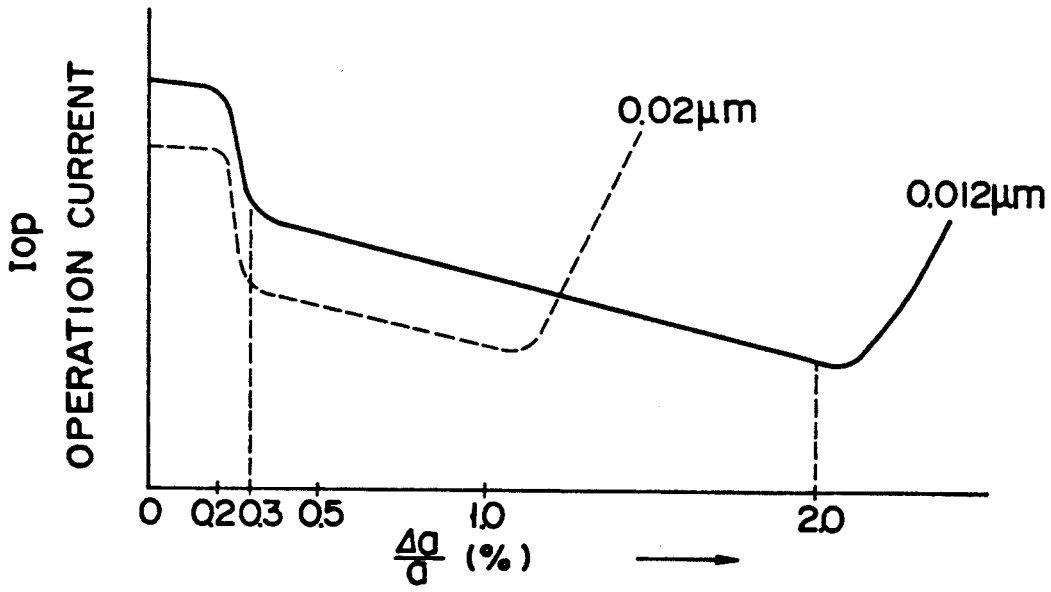
FIG. 8 is a graph showing a thickness of the active layer in the semiconductor laser of FIG. 6 and a change of an operating current.

FIG. 8 shows a change in an operating current depending on a thickness of the active layer 33 and degree of lattice mismatching. This figure shows the operating current when optical power of 10 mW at temperature of 50° C. is obtained. The operating current is large and constant within the range of which the degree of lattice mismatching is about 0.2% or less, and if the degree of the lattice mismatching exceeds the range, the operating current drastically decreases. Then, if the degree of lattice mismatching is 0.3% or more, the operating current becomes sufficiently small. If the degree of lattice mismatching becomes too large, the operating current becomes large again, but the upper example, in a case where the thickness of the active layer 33 is 0.02 µm, the operating current becomes large if the degree of lattice mismatching exceeds 1%. In a case where the thickness of the active layer 33 is 0.012 µm, the operating current becomes large if the degree of lattice mismatching exceeds 2%. Also, in a case where the thickness of the active layer 33 is 0.01 µm (not shown), it is confirmed that the operating current decreases until the degree of lattice mismatching is 2.5%.

In other words, if the lattice constant of the active layer 33 is 0.3 to 2.5% larger than that of the lattice constant of the substrate 30, the same effect as the above can be obtained. Moreover, in a case where the thickness of the active layer 33 is 0.02 µm, the above mentioned effect is outstanding if the lattice constant of the active layer 33 is 0.5 to 1% larger than that of the lattice constant of the substrate 30. Also, in a case where the thickness of the active layer 33 is 0.015 µm, the above mentioned effect is outstanding if the lattice constant of the active layer 33 is 0.75 to 1.5% larger than that of the lattice constant of the substrate 30. The upper limit of the degree of lattice mismatching of the active layer 33 is determined by deterioration of the element which is caused by a misfit dislocation. As the active layer 33 becomes thicker, the upper limit becomes large, and the upper limit is 2.5% if the thickness of the active layer is 0.01 µm. If the thickness of the active layer is too large, the above mentioned effect cannot be obtained, and the upper limit of the thickness is about 0.1 µm.

Particularly, if the thickness of the active layer is illustrated as an X-axis and the degree of lattice mismatching is illustrated as a Y-axis, the operating current can be favorably lowered in an area, which is obtained by connecting the points wherein X=0.015 µm, Y=0.3%; X=0.04 µm, Y=0.3%; X=0.04 µm, Y=0.5%; and X=0.015 µm, Y=1.5%.

Additionally, the above effect can be obtained in the structure wherein the buffer layer 31 is made of n - InGaP, the etching stp layer 35 is made of p - InGaAlP, p - GaAlAs or p - GaAs, the cap layer 37 is made of p - InGaAlP, p - GaAlAs or p - GaAs, the current restricting layer 38 is made of semi-insulating GaAs, n type or semi-insulating GaAlAs, and thickness of p type cladding layer 34 is 0.1 to 0.4 µm. Moreover, the same effect as the above can be expected in even a quantum well structure wherein the active layer 33 is formed of a quantum well layer and barrier layers.

FIG. 9 is a general view showing the degree of the lattice mismatching of the double heterostructure in the semiconductor device relating to the second embodiment of the present invention. The degree of lattice mismatching Δa/a between GaAs substrate 20 and two cladding layers 22 and 24 is substantially zero and Δa/a between GaAs substrate 20 and the active layer is about 1%.

FIG. 10 shows an example wherein the above-mentioned double heterostructure is applied to InGaAlP semiconductor laser having a stabilized transverse mode. In FIG. 10, reference numeral 30 is a substrate (thickness: 80 µm) made of n - GaAs, 31: a buffer layer (thickness: 1 µm) made of n - GaAs, 32: a cladding layer (thickness: 1.45 µm) made of n - $In_{0.5}(Ga_{0.3}Al_{0.7})_{0.5}P$, 33: an active layer (thickness: 0.015 µm) made of $In_{0.8}$-$_2Ga_{0.38}$, 34: a cladding layer (thickness: 1.45 µm) made of p - $In_{0.5}(Ga_{0.3}Al_{0.7})_{0.5}P$, 37: a cap layer (thickness: 500 Å) made of p - $In_{0.5}Ga_{0.5}P$, and 39: a contact layer (thickness: 3 µm) made of p - GaAs.

The structure of the semiconductor laser shown in FIG. 10 is basically the same as the conventional structure of FIG. 1. However, this semiconductor laser differs from the conventional laser device in that the degree of lattice mismatching is increased by changing the composition of the active layer 33. More specifically, in the conventional laser, $In_{0.5}Ga_{0.5}P$ was used as an active layer to lattice-match with GaAs. In this embodiment, $In_{0.62}Ga_{0.38}P$ is used, so that the lattice constant of the active layer 33 is about 1% larger than that of the substrate 30.

The current - optical power output characteristic of this laser device was substantially the same as that of FIG. 5. In this case, the thickness of the active layer 33 was 0.04 µm. The compositions of the cladding layers were equal to each other, and are represented by $In_{1-y}(Ga_{1-x}Al_x)_yP$ wherein x=0.7 and y=0.5. Also, regarding impurity doping of each cladding layer, p type impurity is Zn having concentration of about $1 \times 10^{18}$ cm$^{-3}$ and n type impurity is Si having concentration of about $1 \times 10^{17}$ cm$^{-3}$.

As compared with the conventional structure, in the structure of this embodiment, the degree of lattice mismatching was increased, thereby the oscillation wavelength was made longer by 20 nm and became 690 nm. In the conventional structure, kink was generated when the optical output was 43 mW. In the structure of this embodiment, kink was generated when the optical output was 100 mW and more. Moreover, it was recognized that the reduction of the oscillation threshold current and differential quantum efficiency was improved.

Figure 11:
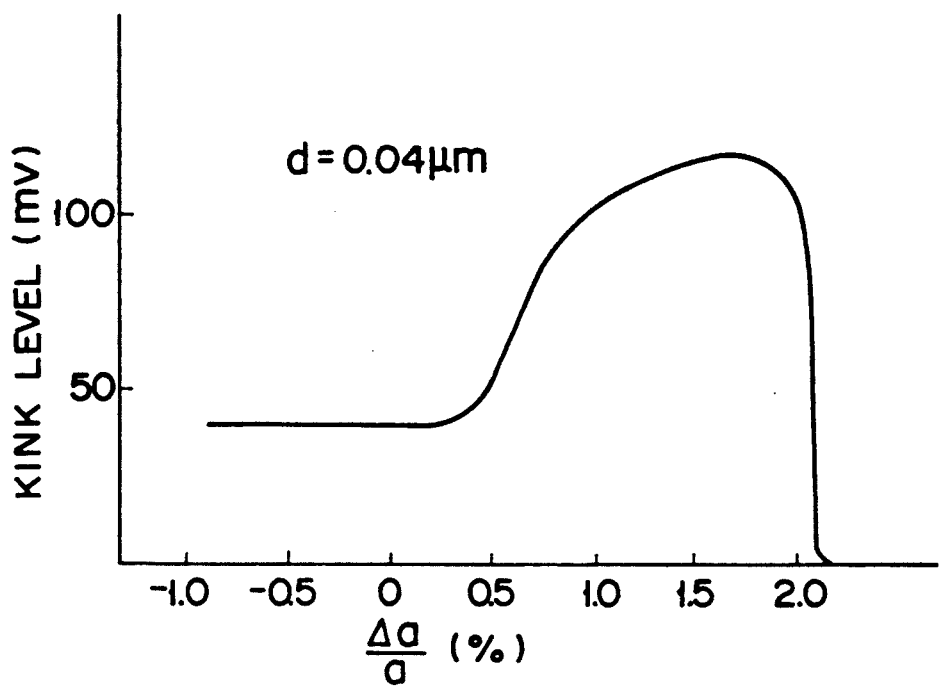
FIG. 11 is a graph showing the relationship between the degree of lattice mismatching in the semiconductor laser of FIG. 10 and a kink level.

FIG. 11 is a graph showing the dependency of the kink level against the degree of lattice mismatching of the active layer 33. In the device wherein the thickness d of the active layer 33 is 0.04 μm, effect of improving the kink level starts to be exerted at the time when the degree of lattice mismatching was about 0.5%, and increases in accordance with increase in the degree of lattice mismatching. Then, the effect of the case wherein the degree of lattice mismatching was about 0.6% was about 1.5 times that of the case wherein the degree of lattice mismatching was zero. Moreover, when the degree of lattice mismatching exceeded 2%, the kink level decreased. This is because the misfit dislocation is generated, the device characteristic is deteriorated, and the oscillation is difficult to be performed. The characteristic shown in FIG. 11 changes depending on the thickness d of the active layer. As the thickness d increases, the kink level drastically decreases and the degree of lattice mismatching becomes smaller. However, the degree of lattice mismatching in which rapid improvement of the kink level is found out does not depend on the thickness d, and is always over 0.5%.

Figure 12:
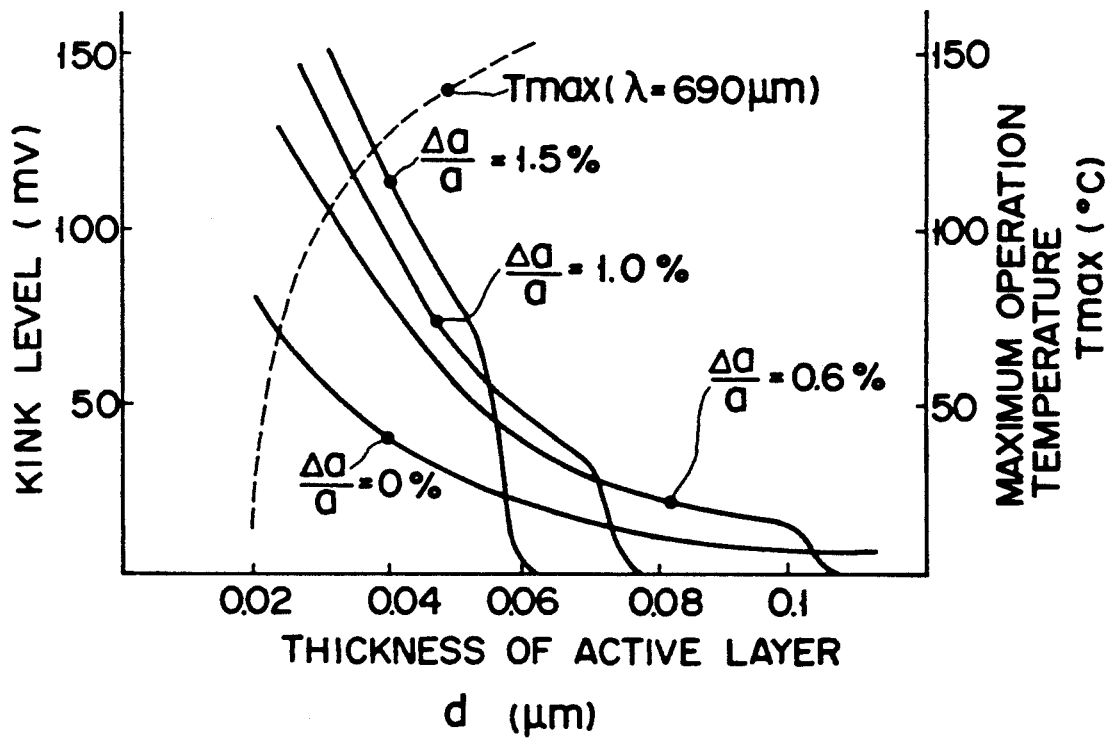
FIG. 12 is a graph showing the relationship among the thickness of the active layer in the semiconductor laser of FIG. 10, the kink level, and a maximum operation temperature.

FIG. 12 is a graph showing dependency of the thickness of the active layer of the kink level and the maximum operating temperature. The kink level was improved if the thickness of the active layer was thinned, but the maximum operating temperature decreased if the thickness of the active layer was thinned. However, in a case of high degree of lattice mismatching, since the kink level was high with the same thickness of the active layer, it was possible to improve the kink level without decreasing the maximum operating temperature. The maximum operating temperature was changed depending on the oscillation wavelength and the operation was performed at the high temperature if the wavelength was long. If the same oscillation wavelength was used, the kink level was slightly improved with the active layer having a large degree of lattice mismatching, but the maximum operating temperature did not decrease. In order to obtain the maximum operating temperature of 70° C., which is necessary for obtaining the stable operation at temperature of 60° C., the thickness of the active layer in the oscillation wavelength of 690 nm was 0.02 μm or more.

On the other hand, if the thickness of the active layer increases, the kink level drastically decreases since it is difficult to perform the oscillation due to the generation of the misfit dislocation. However, the larger the degree of lattice mismatching, this kink level was generated at the portion where the thickness of the active layer was small. Therefore, regarding the degree of lattice mismatching of 0.5% or more, which is effective in improving the kink level, if the degree of lattice mismatching is 0.6%, the maximum thickness of the active layer is 0.1 μm or less. If the degree of lattice mismatching is 1%, the maximum thickness of the active layer is 0.07 μm or less. Moreover, if the degree of lattice mismatching is 1.5%, the maximum thickness of the active layer is 0.06 μm or less.

If the degree of lattice mismatching is changed as mentioned above, the energy gap changes, and the oscillation wavelength changes. However, in InGaAlP material, the oscillation wavelength can be controlled by Al content x, and the order arrangement of atom changing on a crystal growth condition in addition to the lattice mismatching. Consequently, there appeared a tendency for the device characteristic to be slightly improved by the large degree of lattice mismatching similarly to the kink level in a case where the wavelength was the same. This considerably appeared in the reduction of the threshold current and the improvement of the differential quantum efficiency. It can be considered that these effects depend on the facts that the band structure changes by distortion due to the lattice mismatching and the effective mass of the hole in the direction along the surface of the active layer in the same manner in the improvement of the kink level.

Regarding the cause that these effects appear in the degree of lattice mismatching of about 0.5% or more, it is considered that distortion due to such a degree of lattice mismatching is required in order to make a considerable difference between the energy in the end of the small band and the energy in the end of the large band of the effective mass of the hole in the direction along the surface of the active layer depending on the injected carrier density and operating temperature. Moreover, the above effects were surely obtained when the degree of lattice mismatching was set to 0.6% or more.

According to the embodiment shown in FIG. 10, if Ga composition of InGaP active layer 33 is set to be smaller than 0.5, for example, 0.38 to lattice-match with GaAs substrate 30, the lattice constant of the active layer 33 can be made about 1% larger than that of the substrate 30. Then, if the degree of lattice mismatching between the active layer 33 and the substrate 30 is large, distortion is added to the active layer 33, thereby the effective mass of valence band of InGaP constituting the active layer 33 can be made small in the direction along the surface of the active layer.

Due to this, the diffusion length of the hole in the direction along the surface of the active layer can be enlarged, and the generation of kink, which is caused by hole burning effect, can be reduced. Therefore, the same effect as that of the embodiment of FIG. 6 can be obtained. Also, oscillation can be performed in a stable transverse mode in which no kink is generated up to the high optical power. This laser device, therefore, can be used as a laser beam source in which a high density recording of the optical disc can be performed.

Figure 13:
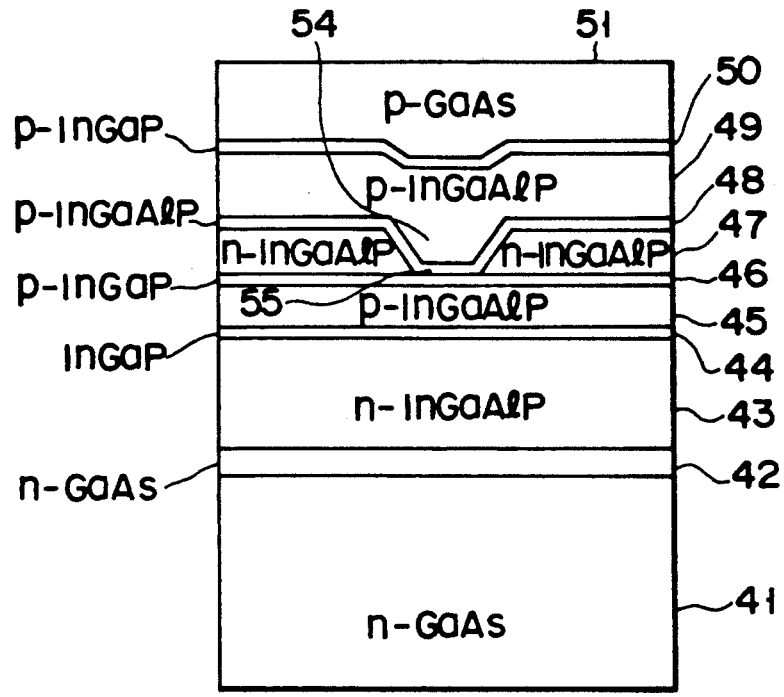
FIG. 13 is a cross sectional view showing a schematic structure of the semiconductor laser relating to the third embodiment of the present invention.
Figure 14:
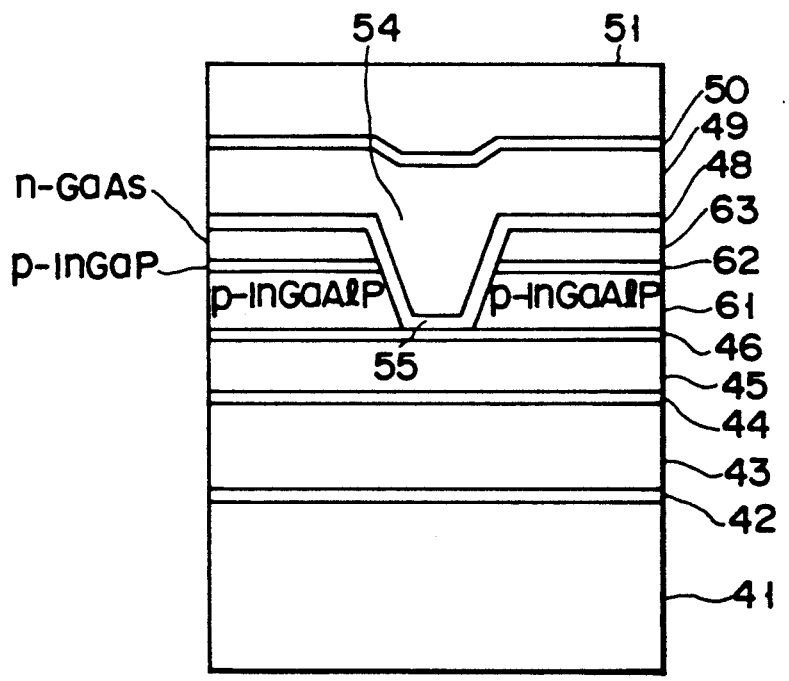
FIG. 14 is a cross sectional view showing a schematic structure of the semiconductor laser relating to the fourth embodiment of the present invention.

FIGS. 13 to 15 are cross sectional views showing a schematic structure of the semiconductor laser devices relating to the third to fifth embodiments of the present invention. In FIG. 13, reference numeral 41 denotes a substrate (thickness: 80 μm) made of n - GaAs, 42: a buffer layer (thickness: 1 μm) made of n - GaAs, 43: a first cladding layer (thickness: 1.3 μm) made of n - nGaAlP, 44: an active layer (thickness: 0.012 to 0.1 μm, Δa/a=0.3 to 2.5%) made of InGaP, 45: a second cladding layer (thickness: 0.1 to 0.3 μm) made of p - InGaAlP, 46: an etching stop layer (thickness: 500 Å) made of p - InGaP, 47: a current restricting layer (thickness: 1 μm) made of n - InGaAlP, and 48: an optical guide layer (thickness: 0.5 μm) made of p - InGaAlP, 49: a third cladding layer (thickness: 1.0 μm) made of GaAlP, 50: an intermediate band gap layer (thickness: 50 Å) made of p - InGaP, and 51: a contact layer (thickness: 2 μm) made of p - GaAs.

If a current is injected into the above-structured semiconductor laser, the injection current is restricted to a current restricting portion 54 by a p-n inversion layer caused due to the current restricting layer 47. Then, light emitting occurs in the active layer 44 substantially along the current restricting portion 54, thereby leading to laser oscillation. In this case, light transmitted to the current restricting layer 47 is confined by a built-in refractive index difference between an optical guide region 55 and the current restricting layer 47. The same effect as that of the first embodiment can be obtained even in the above-mentioned structure.

In the structure shown in FIG. 13, the buffer layer 42, the active layer 44, and the etching stop layer 46 may be made of n - InGaP, InGaAlP, and p - GaAlAs, respectively. Moreover, the current restricting layer 47 may be made of n-type or semi-insulating GaAlAs or semi-insulating InGaAlP. The optical guide layer 48 may be made of p - GaAlAs, and the intermediate band gap layer 50 may be made of p - GaAlAs or p - GaAs.

In the cladding layers 43 and 45, Al content x was set to x=0.7 in $In_{1-y}(Ga_{1-x}Al_x)_yP$. However, Al content may be suitably set to the range where the band gap of the cladding layers 43 and 44 are sufficiently larger than the that of the active layer 44. Moreover, Al content x of the optical guide layer 48 is not limited to x=0.5. Al content thereof may be smaller than that of cladding layers 43 and 45 and larger than that of the active layer. Furthermore, Al content x of the current restricting layer 47 is not limited to x=0.7, and may be suitably changed to the range which is larger than the active layer 44.

The fourth embodiment of the FIG. 14 is different from the above-explained third embodiment in the point that the current restricting layer 47, which was made of n - InGaAlP in FIG. 13, consists of a fourth cladding layer 61, a cap layer 62 and a current restricting layer 63. In this case, the optical guide region 55 is made narrower than the width of the current restricting portion 54, which is defined by the current restricting layer 63. Thereby, making it possible to confine light in a region where a current distribution is uniform, and an astigmatism difference becomes extremely small.

In the fifth embodiment of FIG. 15, reference numeral 71 denotes a substrate (thickness: 80 μm) made of n - GaAs, 72: a buffer layer (thickness: 1 μm) made of n - GaAs or n - InGaP, 73: a first cladding layer (thickness: 1 μm) made of n - InGaAlP, 74: a second cladding layer (thickness: 0.3 μm) made of n - InGaAlP, 75: an active layer (thickness: 0.012 to 0.1 μm), Δa/a=0.3 to 2.5%) made of InGaP or InGaAlP, 76: a third cladding layer (thickness: 0.1 to 0.3 μm) made of p - InGaAlP, 77: an etching stop layer (thickness: 500 Å) made of p - InGaP or p - GaAlAs, 78: a fourth cladding layer (thickness: 1.0 μm) made of p - InGaAlP, 79: an intermediate band gap layer (thickness: 100 Å) made of p - InGaP or p - GaAlAs, 80: a current restricting layer (thickness: 1 μm) made of n - GaAs or n-GaAlAs, and 81: a contact layer (thickness: 2 μm) made of p - GaAs.

In the above-structured semiconductor laser, the band gap of the second cladding layer 74 is made larger than that of the active layer 75, and smaller than that of the first cladding layer 73. Thereby, light density of the active layer 75 can be reduced. Even in this structure, the same effect as mentioned above can be obtained.

Moreover, Al content x in $In_{1-y}(Ga_{1-x}Al_x)_yP$ was set to x=0.7, y=0.5 in the first, third, and fourth cladding layers. However, the Al content may be suitably set in the range where the band gap of the first, third, and fourth cladding layers is sufficiently larger than that of the active layer 75 and larger than that of the second cladding layer 74. Furthermore, Al content of the second cladding layer 74 is not limited to x=0.6, and may be set to the range which is smaller than the first, third, and fourth cladding layers and larger than the active layer 75.

The present invention is not limited to the above-mentioned embodiments. In the above embodiments, the transverse mode control structure shown in FIGS. 6, 10, and 13 to 15 were explained. If the other transverse mode control structure is used, the same effect as mentioned above can be obtained. Moreover, the present invention may be applied to semiconductor laser devices having the structure other than the above-mentioned structure such as a gain guided type or a wide strip type semiconductor. Moreover, the material of the substrate is not limited to GaAs. The material having a lattice constant which is relatively close to the lattice constant of GaAs, can be used as the material of the substrate. Furthermore, the material of the active layer is not limited to InGaAlP. The active layer may be made of GaAlAs, InGaAsP or the like. The clad layer may be made of material of the active layer having the different atomic ratios from that of the active layer.

Furthermore, a ridge stripe direction may be a <011> direction or a <01Ī> direction on a substrate surface (100). Also, it is possible to use a substrate, which is off in a direction of <011> from the surface (100) or a substrate, which is off in a direction of <01Ī> from the surface (100). Here, Ī means that a crystal axis direction is negative.

As mentioned above, according to the present invention, since the lattice constant of the active layer is made 0.3% larger than that of the substrate, it is possible to realize the semiconductor laser device, which can operate at high temperature and improve the maximum operating optical output.

Moreover, if the lattice constant of the active layer is made 0.6% or more larger than that of the substrate, hole burning effect can be controlled and a kink level can be improved in addition to the above effect, thereby making it possible to realize the semiconductor laser device which can improve the maximum operating optical output.

FIG. 16 is a sectional view showing a schematic structure of the semiconductor laser device relating to a sixth embodiment of the present invention. In the drawing, reference numeral 90 denotes a substrate (thickness: 80 μm) made of n - GaAs, 91: a buffer layer (thickness: 1 μm) made of n - GaAs, 92: a cladding layer (thickness: 1.3 μm) made of n - InGaAlP, 93: a quantum well structured active layer (thickness: 0.02 μm), and 94: a cladding layer (thickness: 1.3 μm) made of p - InGaAlP.

A part of the cladding layer 94 is etched halfway and a ridge is formed, and a cap layer 95 made of p - InGaP is formed on the ridge. Then, on the cap layer 95 and the cladding layer 94, there is formed a contact layer 96 made of p - GaAs.

Figure 17:
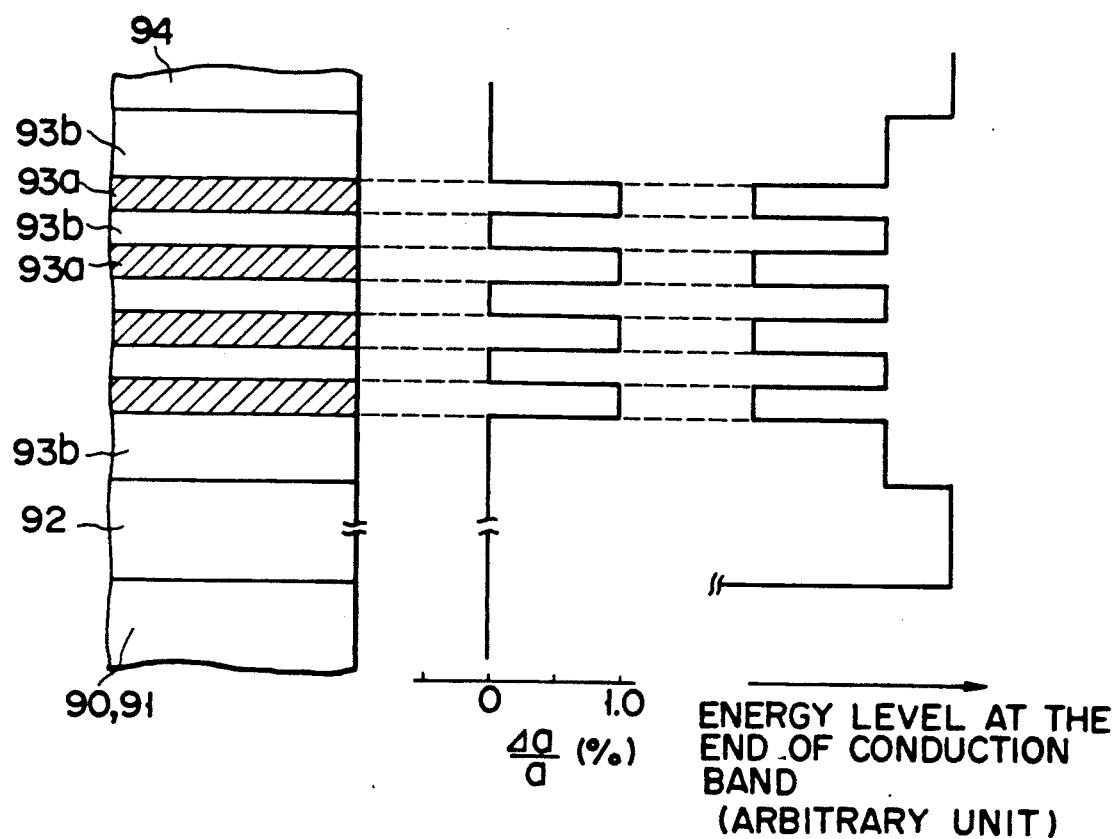
FIG. 17 is a view showing a degree of the lattice mismatching of the quantum well structure in the semiconductor laser of FIG. 16.

As shown in FIG. 17, the quantum well structured active layer 93 is formed by that a quantum well layer 93 and a wall layer 93 are layered. Also, the material of the quantum well layer 93 is $In_{1-y}(Ga_{1-x}Al_x)_yP$ ($0 \leq x < 1$, $0 \leq y < 1$), and the material of the barrier layer 93b is $In_{1-t}(Ga_{1-s}Al_s)_tP$ ($0 \leq s < 1$, $0 \leq t < 1$).

The above-mentioned structure is basically the same as the conventional structure. However, in this embodiment, it is featured that the composition of the quantum well layer 93a is changed and the degree of lattice mismatching between the quantum well layer 93a and the substrate 90 is made large. FIG. 17, right side portion shows the degree of lattice mismatching of each layer close to the active layer in the laser device of this embodiment, and a conductive band end energy level. The mixed crystal composition of each layer is set so that the energy gap of the quantum well layer 93a is made smaller than that of the barrier layer 93b and the energy gap of the barrier layer 93b is made smaller than the cladding layers 92 and 94, thereby forming the quantum well structure. The conductivity types of the cladding layers 92 and 94 are opposite to each other, and an electron and a hole are respectively injected into the active layer 93. The degree of lattice mismatching between cladding layers 92, 94 and the substrate 90 is substantially equal to each other, and the degree of lattice mismatching between the barrier layer 93b and the substrate 90 is substantially equal to each other. Also, the degree of lattice mismatching of the quantum well layer 93a is set about 1% larger than that of the substrate 90.

The following shows an example wherein the above-set quantum well structured active layer is applied to InGaAlP semiconductor laser device having the transverse mode control structure shown in FIG. 16. The above semiconductor laser device was structured as follows.

The quantum well layer 93a having a thickness of 80 Å is made of $In_{0.62}Ga_{0.38}P$ (four layers), and the barrier layer 93b is made of $In_{0.5}(Ga_{0.6}Al_{0.4})_{0.5}P$ (thickness: a layer between the quantum well layers is 60 Å, and a layer adjacent to the cladding layers 92 and 94 is 500 Å). Moreover, the cladding layer 92 is made of $n-In_{0.5}(Ga_{0.3}Al_{0.7})_{0.5}P$, and the cladding layer 94 is made of $p-In_{0.5}(Ga_{0.3}Al_{0.7})_{0.5}P$. Regarding impurity doping of cladding layers 92 and 94, Zn was used as an impurity of p type and its concentration was set to about $1 \times 10^{18}$ $cm^{-3}$. Moreover, Si was used as an impurity of n type and its concentration was set to about $5 \times 10^{17}$ $cm^{-3}$. This is the same as the conventional structure having the quantum well structured active layer. However this structure differs from the conventional structure in the point that the composition of the quantum well layer 93a is changed, thereby increasing the degree of lattice mismatching.

Figure 18:
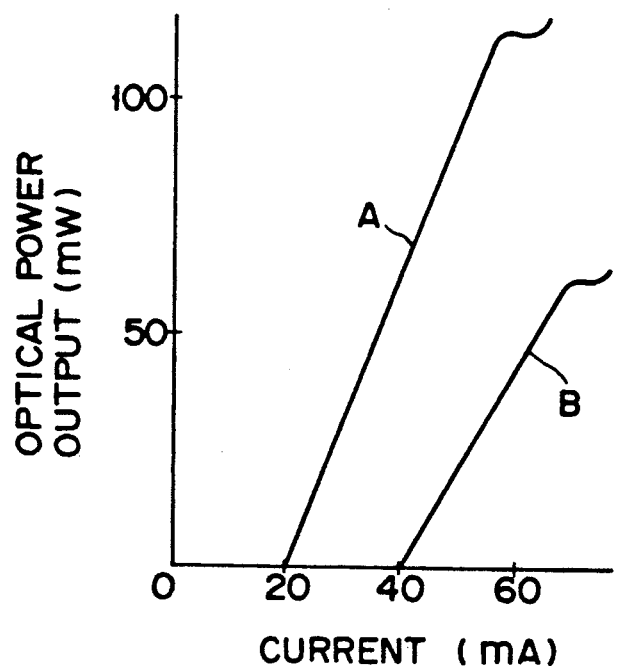
FIG. 18 is a graph showing the relationship between the current of the semiconductor laser of FIG. 16 and the optical output.

FIG. 18 shows a current - optical power output characteristic of the laser device. In the drawing, a curve A shows a current - optical output characteristic in a case where the quantum well structured active layer of this embodiment is used and a curve B shows a current - optical output characteristic in a case where the conventional quantum well structured active layer is used. In the conventional structure, the degree of lattice mismatching between the quantum well layer and the substrate is within 0.2%. The degree of lattice mismatching of the active layer was confirmed by a photo luminescent wavelength, an X-ray diffraction, and a transmissivity type electron microscope. As compared with the conventional structure, the oscillation wavelength in the laser device of this embodiment was made longer by 20 nm and was 675 mn. This was substantially the same as the double heterostructure laser (oscillation wavelength: 670 nm) using a InGaP bulk lattice-matching with GaAs as an active layer. In the conventional structure, kink was generated when the optical output was about 60 mW. However, in this embodiment, kink was generated when the optical output was 120 mW or more. Moreover, in this embodiment, an oscillation threshold current decreased to about 20 mA, which is about the half value of the conventional structure, and it was recognized that the differential quantum efficiency was improved.

Figure 19:
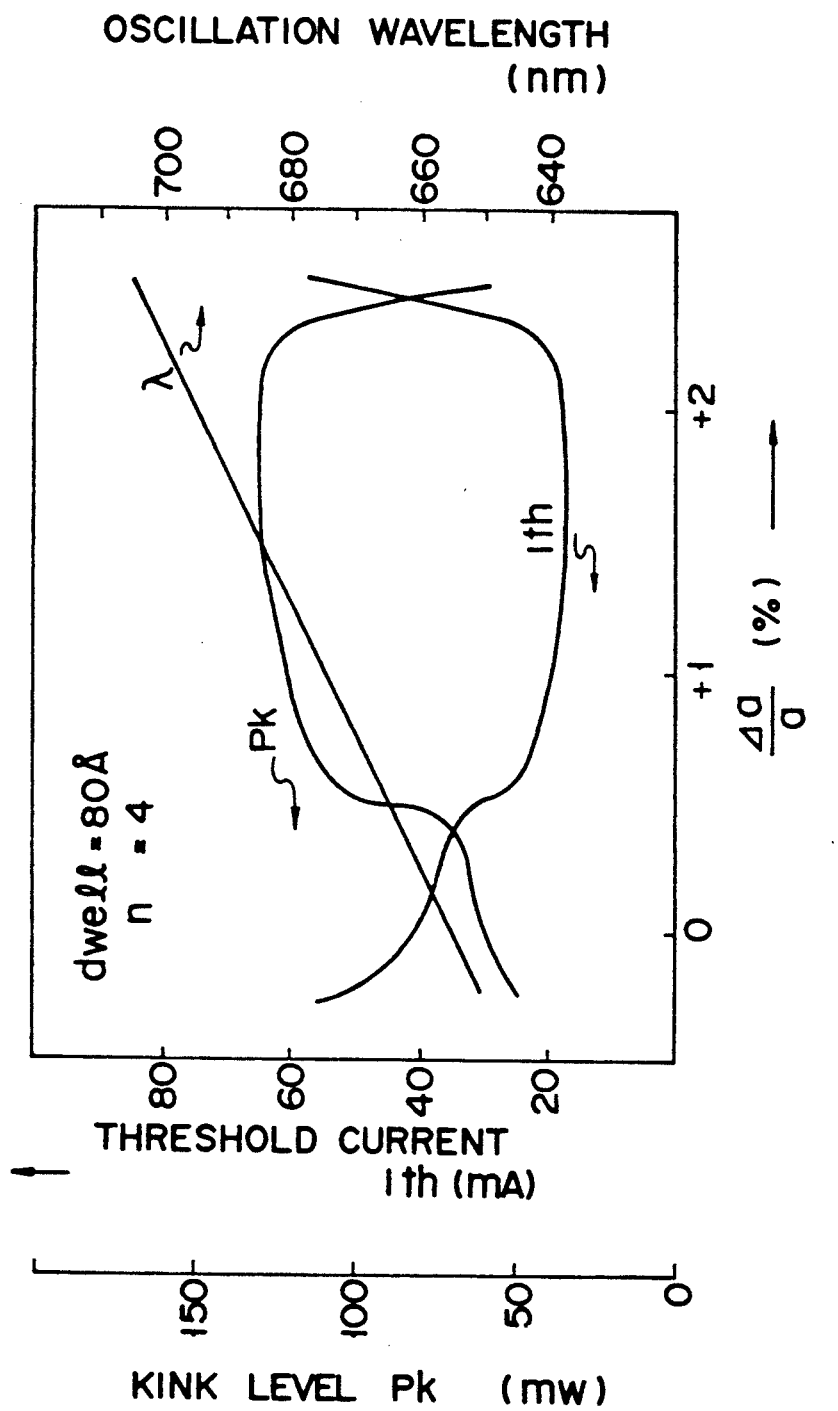
FIG. 19 is a graph showing the relationship among the degree of lattice mismatching in the semiconductor laser of FIG. 16, the kink level, and an oscillation threshold current.

FIG. 19 shows dependency of kink level Pk, threshold current $I_{TH}$, and oscillation wavelength $\lambda$ on the degree of lattice mismatching $\Delta a/a$ of the quantum well structured active layer 14. The effect of the improvement of the kink level appeared when the degree of lattice mismatching was about 0.5%. Then, the kink level increased a the degree of lattice mismatching increased, and when the degree of lattice mismatching was about 0.6%, the kink level was about twice that of the case when the degree of lattice mismatching was zero. However, the kink level rapidly decreased when the degree of lattice mismatching exceeded 2.2%. This was because the misfit dislocation was generated, so that the element characteristic was deteriorated and the oscillation was difficult to be performed.

Moreover, the oscillation wavelength was made longer as the degree of lattice mismatching increased. Then, an overflow current decreased, and the oscillation threshold current lowered. Moreover, the threshold current drastically lowered at the point when the degree of lattice mismatching exceeded 0.5%. It can be considered that this is because influence of the change in the valence band structure due to effect of distortion considerably appears. Also, the threshold current and the kink level rapidly increased when the degree of lattice mismatching exceeded 2.2% for the same reason. The oscillation, which is performed at a low threshold value due to these effects, exerted large effect on increase in the maximum operating temperature, and the stable high output oscillation can be obtained at a room temperature or more.

FIG. 19 showed the characteristic when the thickness of the quantum well layer 93a was 80 Å. However, if the thickness of the quantum well layer 93a changes, the characteristic also changes. The quantum well layer cannot be thinned too much in view of the matter of manufacturing. In this embodiment, since the lattice constant of the quantum well layer is shifted from that of the substrate, it is difficult for the quantum well layer to be formed thick. According to the experiment made by the inventors of this invention, in a case where the thickness of the quantum well layer was 50 Å, the improvement of the kink level appeared when the degree of lattice mismatching was around 0.5% similar to FIG. 19. Then, the kink level drastically decreased when the degree of lattice mismatching was around 3%. Moreover, in a case where the thickness of the quantum well layer was 100 Å, the improvement of the kink level appeared when the degree of lattice mismatching was around 0.5% like in FIG. 19. Then, the kink level drastically decreased when the degree of lattice mismatching was around 2%. In view of the above facts, in a case the thickness of the quantum well layer is 50 to 100 Å, the most desirable degree of lattice mismatching ranges 0.6 to 2%. Therefore, the composition ratio of the quantum well layer may be set to be in the above range.

If the degree of lattice mismatching is changed as mentioned above, the energy gap changes, and the oscillation wavelength changes. However, in InGaAlP material, the oscillation wavelength can be controlled by the order arrangement of atom changing depending on Al content x, and a crystal growth condition in addition to the lattice mismatching. Consequently, there appeared a tendency for the element characteristic to be slightly improved by the large degree of lattice mismatching like the kink level if the wavelength is the same. This considerably appeared in the reduction of the oscillation threshold current and the improvement of the differential quantum efficiency. It can be considered that these effects depend on the facts that the band structure changes by distortion due to the lattice mismatching and the effective mass of the hole in the direction along the surface of the active layer was made small like the improvement of the kink level.

Regarding the cause that these effects appear from the degree of lattice mismatching of about 0.5%, it is considered that distortion due to such a degree of lattice mismatching is required in order to make a considerable difference between the band end of the small band of the effective mass of the hole in the direction along the surface of the active layer and the energy of the band end of the large band.

According to the above embodiment, in the semiconductor laser device wherein the double heterostructure having the quantum well structure on a GaAs substrate is formed, Ga composition y of $In_{1-y}Ga_yP$ quantum well layer 93a is set to 0.38, which is a smaller value, 0.5%, which lattice-matches with the substrate 90. Then, the lattice constant of the quantum well layer 93a is 1% larger than that of the substrate 90. Due to this, the energy gap of the quantum well layer 93a is made smaller than y=0.5, the energy gap difference between the cladding layers 92, 94 and the quantum well layer can be largely maintained. Thereby, it is possible to prevent the injection carrier confining effect, which is caused by shortening the wavelength due to the quantum well structure, from being decreased. Also, it is possible to prevent the threshold current and the operating temperature from being decreased. Then, it is possible to perform oscillation in a stable transverse mode without kink at the high optical output. As is obvious from FIG. 19, there can be realized the laser device wherein the threshold current is sufficiently low, that is, 20 mA, and the kink level is sufficiently high, that is, 12 mW.

The above embodiment explained the structure with stabilized transverse as shown in FIG. 16. The effect of improvement of the kink level due to the degree of lattice mismatching of the quantum well layer is determined by the quantum well structure. Therefore, it goes without saying that the same effect can be obtained even in the other structure with stabilized transverse mode if the kink level is limited to the above-mentioned mechanism. Also, the material of the quantum well structure is not limited to InGaAlP, and InGaAsP can be used. Moreover, the present invention can be applied to a direct transition type compound semiconductor wherein the lattice constant changes depending on the composition. Additionally, the present invention can be variously modified without departing from the scope of the invention.

As mentioned above, according to the present invention, in the semiconductor laser device having the quantum well structure active layer, which was formed on the compound semiconductor substrate and made of InGaAlP, the difference between the lattice constant of the quantum well layer and that of the substrate is made large, and he kink level can be improved without increasing the threshold current, thereby making it possible to perform oscillation in the stable transverse mode without any kink up to the high optical output.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor laser device comprising a compound semiconductor substrate, a double heterostructure which is formed on the compound semiconductor substrate said double heterostructure comprises an active layer comprising first and second surfaces, a first cladding layer formed on the first surface of the active layer and a second cladding layer formed on the second surface of the active layer and wherein the improvement comprises:

that the active layer comprises an $In_{1-y}(Ga_{1-x}Al_x)_yP$ material ($0 \leq x < 1$, $0 \leq y < 1$) having a lattice constant larger than the lattice constant of the substrate by at least 0.6%.

2. The semiconductor laser device according to claim 1, wherein said lattice constant of said active layer is larger than that of said substrate by no more than 3.9%.

3. The semiconductor laser device according to claim 1, wherein said lattice constant of said active layer is larger than that of said substrate by no more than 2.5%.

4. The semiconductor laser device according to claim 1, wherein said lattice constant of said active layer is larger than that of said substrate by no more than 2%.

5. The semiconductor laser device according to claim 1, wherein the thickness of said active layer is 0.01 to 0.1 $\mu$m.

6. The semiconductor laser device according to claim 1, wherein the thickness of said active layer is $0.02 \pm 0.008$ $\mu$m.

7. The semiconductor laser device according to claim 1, wherein said substrate is made of GaAs, said first and second cladding layers are made of $In_{1-W}(Ga_{1-V}Al_V)_WP$ material ($0 \leq V < 1$, $0 \leq W < 1$), and have conductivity type opposite to each other, and the lattice constant of said cladding layer matches with that of said substrate.

8. The semiconductor laser device according to claim 1, further comprising an etching stop layer formed on said second cladding layer, a third cladding layer selectively formed in a ridge shape on said etching stop layer, a cap layer formed on said third cladding layer, and a current restricting layer formed on said etching stop layer to be adjacent to said third cladding layer.

9. The semiconductor laser device according to claim 1, further comprising an etching stop layer formed on said second cladding layer, a current restricting layer selectively formed on both sides of said etching stop layer, an optical guide layer formed on said current restricting layer, and a third cladding layer formed on said optical guide layer.

10. The semiconductor laser device according to claim 9, further comprising a fourth cladding layer formed between said etching stop layer and said current restricting layer.

11. The semiconductor laser device according to claim 1, further comprising an etching stop layer formed on said second cladding layer, a third cladding layer selectively formed in a ridge shape on said etching stop layer, an intermediate band gap layer formed on said third cladding layer, and a current restricting layer formed on said etching stop layer to be adjacent to said third cladding layer.

* * * * *